United States Patent [19]

Woike et al.

[11] Patent Number: 4,713,795
[45] Date of Patent: Dec. 15, 1987

[54] OPTICAL SWITCH, ESPECIALLY FOR INFORMATION STORAGE AND RETRIEVAL

[75] Inventors: Theo Woike, Cologne; Wolfgang Krasser, Jülich; Siegfried Haussühl, Erftstadt, all of Fed. Rep. of Germany

[73] Assignee: Kernforschungsanlage Julich GmbH, Julich, Fed. Rep. of Germany

[21] Appl. No.: 792,655

[22] Filed: Oct. 29, 1985

[51] Int. Cl.⁴ .................... G03C 1/72; G11C 13/00; G02F 1/01
[52] U.S. Cl. .................................. 365/119; 350/354
[58] Field of Search ................ 365/106, 110, 119; 350/356, 357, 354

[56] References Cited

U.S. PATENT DOCUMENTS

| | | | |
|---|---|---|---|
| 3,445,826 | 5/1969 | Myers | 365/110 |
| 4,166,254 | 8/1979 | Bjorklund | 350/354 X |
| 4,382,660 | 5/1983 | Pratt, Jr. et al. | 350/354 X |
| 4,626,075 | 12/1986 | Chemla | 350/354 X |

OTHER PUBLICATIONS

Physical Review Letters, vol. 53, No. 18, by Woike et al, Oct. 1984, Extremely Long Living Metastable State of $Na_2[Fe(CN)_5NO]\cdot 2H_2O$ Single Crystals.

Primary Examiner—Stuart N. Hecker
Assistant Examiner—Alyssa H. Bowler
Attorney, Agent, or Firm—Frishauf, Holtz, Goodman & Woodward

[57] ABSTRACT

Nitroprusside single crystals having the formula $M_n[Fe(CN)_5]nH_2O$, where M is a metal that forms a nitroprusside is found to have the property, when cooled to a temperature in the range between 160° K. and 250° K., of convertability into a long-duration metastable state by irradiation with coherent blue-green light and to return to the original state when irradiated with red light. Barium nitroprusside $Ba[Fe(CN)_5]2H_2O$ can be switched rapidly from one state to the other without requiring cooling below about 200° K. and lends itself particularly well to making single crystal memories for writing with a blue-green laser beam and reading with a red laser beam, with the readout being picked up by a photodetector diode array, on which the radiation from the nitroprusside crystal is focused. The incident laser beams are pulsed and the photodetector is turned off during pulsing. Movable laser mirrors are used to direct the laser beams to locations on the surface of the crystal in a manner controlled by an address program.

24 Claims, 1 Drawing Figure

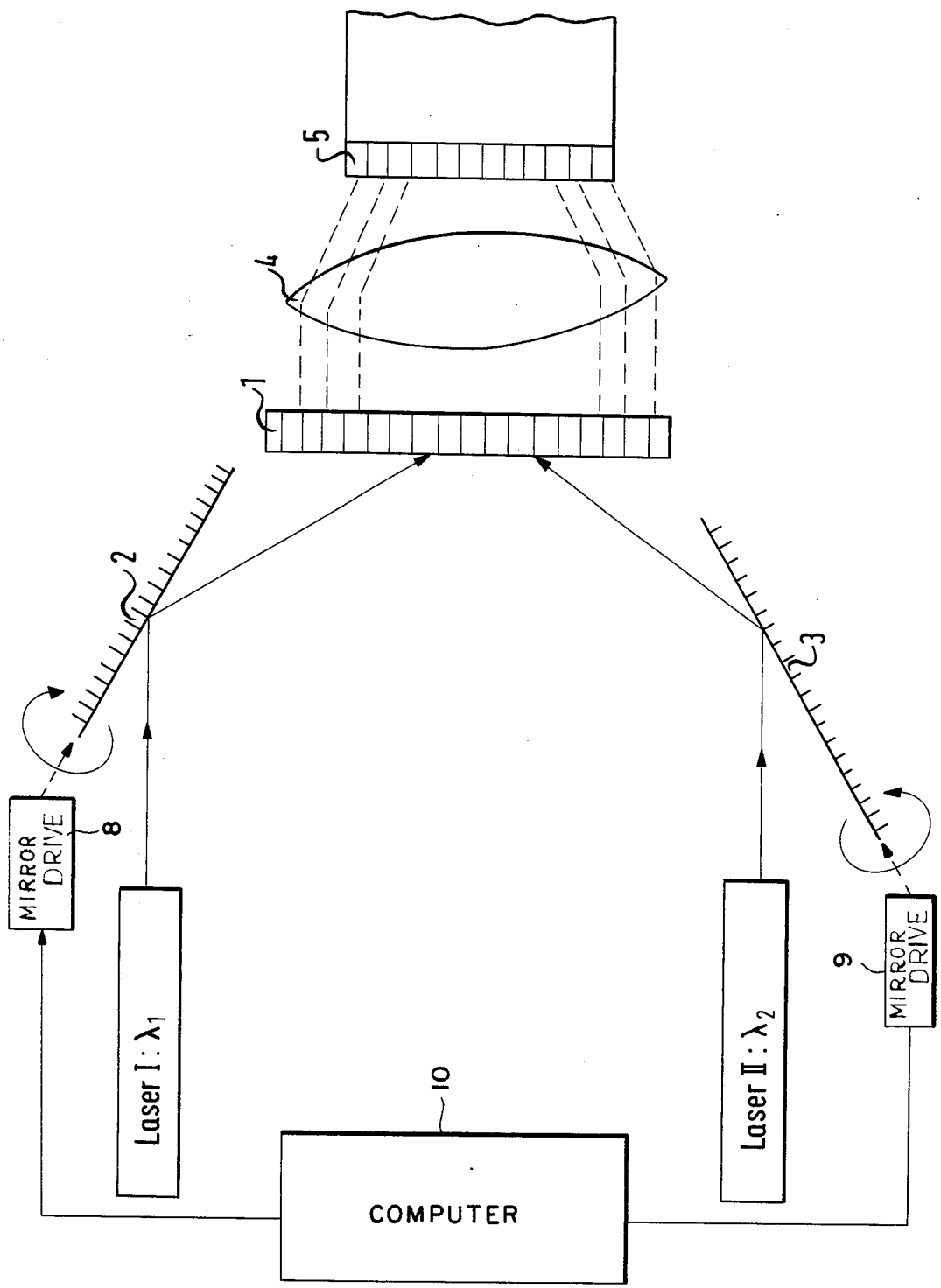

OPTICAL SWITCH, ESPECIALLY FOR INFORMATION STORAGE AND RETRIEVAL

The invention concerns an optical switch suitable for information storage, consisting of a storage medium, a light source for producing radiation for radiatively pumping the storage medium to store energy at a particular location thereof and for stimulating the emission of radiation to release energy therefrom, means for directing the radiation so as to direct irradiation to particular parts of the medium in accordance with a pattern and a photodetector for counting the photons emitted from the various locations of the storage medium as they are irradiated.

The so-called "optical computer" is at the present time the subject of research and development. Before this invention the search for a suitable storage medium, which might make possible a breakthrough for the optical computer problem, had not been successful.

SUMMARY OF THE INVENTION

An object of the present invention is to provide an optical switch or information storage device usable at least in a portion of information processing technology, based on a medium suitable for optically storing and reading out information by optically switching a local portion of the medium from one state to another and optically switching local portions of the medium in the reverse direction to the first mentioned state.

Briefly, such a medium has been discovered, namely a single crystal of the nitroprusside of a metal containing water of crystallization, which may be represented by the formula $M_m[Fe(CN)_5NO] \cdot nH_2O$, which can be pumped by radiation having a first wavelength $\lambda_1$ in the range between 400 and 530 nm and can be read out by stimulated emission by means of radiation of a second wavelength $\lambda_2$ in the range from 600 to 680 nm for operation of the switching and storage device in a temperature range between 140° and 210° K.

It has been found that the atom lattice of nitroprusside single crystals, sometimes referred to a nitrosyl prusside single crystals, at low temperatures down to 140° K., can be converted with intensive light into a metastable stage in which it has a very long life that for practical purposes can be regarded of indefinite duration. This metastable state is conveniently referred to as state 1. The intensive light is typically coherent light, produced by a laser.

The transformation of the single crystal into the metastable state "1", referred to as "pumping takes place selectively upon the incidence of radiation in the range $\lambda_1$ defined above, which may roughly be described as blue-green. The reverse transformation to the original state, 0, which may be regarded as erasing, takes place selectively upon the incidence of radiation in the wavelength range $\lambda_2$, which may roughly be described as red. The transformation between the two states 0 and 1 is reversible and can be repeated as often as desired, and the rapidity of these transformations, so far as can yet be determined take place in intervals of the order of $10^{-12}$ seconds (cf. nuclear oscillation).

The irradiated location or part of the single crystal which is converted into state 1 has a smaller transmission for the radiation used than the crystal portion left in its original state, i.e., state 0. This results in the possibility of recognizing the locally excited state by means of the number of transmitted photons or also by means of the number of backscattered photons.

An embodiment of the invention can be used selectively as a rapid switch or as an information storage device of practically indefinite storage time, according to whether the stored information is read out directly after storage under computer control or only after the lapse of a longer period of time.

The processes of transformation and retransformation are independent of the dimensioning of the single crystal. When a photodetector is disposed to respond to radiation transmitted through, backscattered by or simulated from the single crystal, it is desirable for the single crystal to be in the shape of a thin plate or disc of a thickness in the range from about 0.05 nm to 0.2 nm.

By the use of such a single crystal, it is possible to determine the state of various locations in the crystal by reference to the transmission of radiation, i.e., to measure with the photodetector the number of photons leaving the single crystal at the particular location.

A useful type of embodiment of the switch or storage device of the invention, is provided when the light source consists of two lasers having a power output of a few small mW. The one of these lasers that emits radiation of the wavelength $\lambda_1$ then serves for pumping the single crystal in a manner resolved as to location (e.g., by scanning), while the other one, which emits radiation of wavelength $\lambda_2$, is used for reading the crystal in a manner resolved as to location. It is further helpful in practice for the laser to be constituted as a pulsed laser. The transformation into the metastable state 1 then takes place by means of a pulse during which the photodetector can be shut off. Reading out correspondingly takes place also by means of a pulse.

In a particularly advantageous embodiment the invention, the crystal is a crystal of $Ba[Fe(CN)_5NO] \cdot nH_2O$ which may be referred to as barium nitroprusside. The particular proportion of hydration (so-called water of crystallization) is unimportant, as the foregoing formula indicates. When a single crystal of that material is used, it is sufficient to provide cooling down to about 200° K., for example in the range between 190° and 210° K., even though the transformation and retransformation between states is also possible at lower temperatures.

Of course it is necessary for information storage purposes to direct the writng and reading or erasing of laser beams to particular locations in some progression or sequence, as will bo illustrated in the description that follows.

BRIEF DESCRIPTION OF THE DRAWINGS

The invention is further described by way of illustrative example with reference to the drawing, the single figure of which is a schematic representation of informatin storage apparatus embodying the invention.

DESCRIPTION OF THE ILLUSTRATED EMBODIMENT

A single crystal 1 is shown in the drawing onto which the light beams $\lambda_1$, $\lambda_2$ of a laser I and of laser II, each with a power output of a few milliwatts, are directed by reflection from the laser mirrors 2 and 3. A computer control equipment symbolically shown in the drawing moves the laser mirrors 2 and 3 in such a way that the respective beams of the two lasers reach the surface of the single crystal 1 in accordance with a prescribed program. Moving or aiming mirrors directed by electrical signals for scanning or otherwise addressing a surface are well known and need not be further described here. For this reason the mirror movers 8 and 9 and the computer 10 that controls them are shown simply as symbolical blocks.

The pulsed radiation of the laser I has a wavelength in the range $\lambda_1$. At every location of the single crystal 1 on which a pulse from the laser I is incident, the metastable state 1 is produced. Whether a common photodetector cell is used, or as in this case an array 5 of photosensitive diodes each corresponding to a different location of the single crystal is used, the detecting arrangement is shut off during the pulse.

For reading out information or otherwise switching back to the original state, pulses of the laser II operating at the wavelength $\lambda_2$ is directed to the locatiors of the single crystal by way of the laser mirror 3 that is likewise moveable under computer control. Photon rays are then directed through the lens system 4 to corresponding diodes of the photodetector 5 in a manner dependent upon the state of the locations irradiated by the laser II, the metastable states 1 being transformed back to state 0 at the same time in this operation. These signals received from the photodetector 5 are then supplied for further processing to other apparatus now shown in the drawing, whether that be for data processing, graphic representation of information or some other purpose.

The diode array 5 shown in the drawing constitutes a socalled parallel output from the single crystal storage medium, but a series, or sequential, output could be provided in a photodetector that reads all the light coming from the single crystal, for resolution on a time basis with reference to the scanning pattern used by the laser mirrors. It should be mentioned that sodium nitroprusside, $Na_2[Fe(CN)_5NO] \, 2H_2O$ has been found capable of being reversibly transformed into an extremely long-living metastable state by irradiation in the range from 400 to 530 nm at a temperature between 140° and 170° K. It can be brought back to its original state by red light, at a wavelength of 676 nm. It would appear that in this case the temperature needs to be lower for excitation to the metastable state and higher for return to the ground state with a crossover at 160° K.

It is accordingly to be expected that other metallic nitroprusside single crystals, especially the nitroprussides of alkalic metals and of alkaline earth metals, and perhaps others as well, can be expected to show similar properties useful for optical switching and storage in accordance with the invention.

Thus, although the invention has been described with reference to preferred and particular illustrative embodiments, it will be recognized that modifications and variations are possible within the inventive concept.

What is claimed is:

1. Optical switch capable of use for information storage, utilizing a medium capable of being converted from an original state to a metastable state by a radiative pumping by intensive light having a first wavelength ($\lambda_1$) and capable of being returned to said original state by intensive light having a second wavelength ($\lambda_2$), comprising a source of light of said first and second wavelengths, said storage medium, means for directing radiation of said first and second wavelengths for localized incidence on said medium and photodetector means for measuring radiation coming from said medium, said medium being a nitroprusside single crystal of the formula $M_m[Fe(CN)_5NO]nH_2O$, wherein M is a metal capable of forming a nitroprusside salt, m is a valence-determined number determined by the valence of the metal M and the $-2$ valence of the nitroprusside group $[Fe(CN)_5NO]$ and n is an integer in range 0, 1, 2, 3 ... 10, said first light wavelength being in the range between 400 and 530 mn, said second light wavelength being in the range from 600 to 680 nm, and means being provided for cooling said single crystal at a temperature in the range between 140° K. and 210° K.

2. Optical switch according to claim 1, in which the material of said single crystal is selected from the group consisting of nitroprussides of alkali metals and nitroprussides of alkaline earth metals.

3. Optical switch according to claim 2, in which said first light wavelength is a wavelength in the range between 430 and 510 nm, and said second light wavelength is a wavelength in the range between 600 and 660 nm.

4. Optical switch according to claim 3, in which said single crystal is in the form of a wafer having a thickness in the range between 0.05 mm and 0.25 mm.

5. Optical switch according to claim 3, in which said light source comprises a first laser (I) for emission of light at said first wavelength and a second laser (II) for emission of light at said second wavelength; and said means directing light from said first and second lasers to said single crystal comprise first (2) and second (3) movable laser mirrors.

6. Optical switch according to claim 4, in which said light source comprises a first laser (I) for emission of light at said first wavelength and a second laser (II) for emission of light at said second wavelength; and said means directing light from said first and second lasers to said single crystal comprise first (2) and second (3) movable laser mirrors.

7. Optical switch according to claim 5, in which said lasers are pulsed lasers.

8. Optical switch according to claim 6, in which said lasers are pulsed lasers.

9. Optical switch according to claim 3, in which the material of said single crystal is barium nitroprusside, $Ba \, [Fe(CN)_5NO]nH_2O$.

10. Optical switch according to claim 4, in which the material of said single crystal is barium nitroprusside, $Ba \, [Fe(CN)_5NO]nH_2O$.

11. Optical switch according to claim 5, in which the material of said single crystal is barium nitroprusside, $Ba[Fe(CN)_5NO]nH_2O$.

12. Optical switch according to claim 6, in which the material of said single crystal is barium nitroprusside, $Ba[Fe(CN)_5NO]nH_2O$.

13. Optical switch according to claim 7, in which the material of said single crystal is barium nitroprusside, $Ba[Fe(CN)_5NO]nH_2O$.

14. Optical switch according to claim 8, in which the material of said single crystal is barium nitroprusside, $Ba[Fe(CN)_5NO]nH_2O$.

15. Optical switch according to claim 9, in which said cooling means is provided for maintaining said single crystal at a temperature in the range between 190° K. and 205° K.

16. Optical switch according to claim 10, in which said cooling means is provided for maintaining said single crystal at a temperature in the range between 190° K. and 210° K.

17. Optical switch according to claim 11, in which said cooling means is provided for maintaining said single crystal at a temperature in the range between 190° K. and 210° K.

18. Optical switch according to claim 12, in which said cooling means is provided for maintaining said single crystal at a temperature in the range between 190° K. and 210° K.

19. Optical switch according to claim 13, in which said cooling means is provided for maintaining said single crystal at a temperature in the range between 190° K. and 210° K.

20. Optical switch according to claim 14, in which said cooling means is provided for maintaining said single crystal at a temperature in the range between 190° K. and 210° K.

21. Optical switch according to claim 2, in which said second wavelength is in the range between 665 and 680 nm and in which said cooling means is provided for maintaining said single crystal within the temperature range between 140° K. and 170° K.

22. Optical switch according to claim 21, in which said single crystal is in the form of a wafer having a thickness in the range between 0.05 mm and 0.25 mm.

23. Optical switch according to claim 21, in which the material of said single crystal is sodium nitroprusside, $Na_2[Fe(CN)_5NO]\ 2\ H_2O$.

24. Optical switch according to claim 22, in which the material of said single crystal is sodium nitroprusside, $Na_2[Fe(CN)_5NO]\ 2\ H_2O$.

* * * * *